(12) United States Patent
Amar et al.

(10) Patent No.: US 9,768,693 B2
(45) Date of Patent: Sep. 19, 2017

(54) COMPENSATION CIRCUIT, COMMUTATION CELL AND POWER CONVERTER CONTROLLING TURN-ON AND TURN-OFF OF A POWER ELECTRONIC SWITCH

(71) Applicant: TM4 INC., Boucherville (CA)

(72) Inventors: Mohammed Amar, Montreal (CA); Jean-Marc Cyr, Candiac (CA); Maalainine El Yacoubi, Montreal (CA); Pascal Fleury, Sainte-Madeleine (CA)

(73) Assignee: TM4 INC., Boucherville (CA)

( * ) Notice: Subject to any disclaimer, the term of this patent is extended or adjusted under 35 U.S.C. 154(b) by 0 days.

(21) Appl. No.: 15/036,554

(22) PCT Filed: Nov. 6, 2014

(86) PCT No.: PCT/CA2014/051065
§ 371 (c)(1),
(2) Date: May 13, 2016

(87) PCT Pub. No.: WO2015/070344
PCT Pub. Date: May 21, 2015

(65) Prior Publication Data
US 2016/0301308 A1     Oct. 13, 2016

Related U.S. Application Data

(60) Provisional application No. 61/904,045, filed on Nov. 14, 2013.

(51) Int. Cl.
*H02M 3/158* (2006.01)
*H02M 1/08* (2006.01)
(Continued)

(52) U.S. Cl.
CPC ............ *H02M 3/158* (2013.01); *H02M 1/08* (2013.01); *H03K 17/0828* (2013.01);
(Continued)

(58) Field of Classification Search
CPC .. H02M 1/08; H02M 1/32; H02M 2001/0058; H02M 3/155; H02M 2001/0054
See application file for complete search history.

(56) References Cited

U.S. PATENT DOCUMENTS 4,777,386 A * 10/1988 Majumdar ........... H03K 17/615
327/109
5,723,916 A * 3/1998 Disney .................... F02P 3/051
123/630
(Continued)

FOREIGN PATENT DOCUMENTS

WO     2013082705      6/2013
WO     2014043795      3/2014
(Continued)

OTHER PUBLICATIONS

Azeroual et al., "Limiting the Overshoot on IGBT During Turn-Off Using Stray Inductance," Development Power Electronics, ATZ Elektronik, vol. 7, 5 pages, May 2012.
(Continued)

*Primary Examiner* — Timothy J Dole
*Assistant Examiner* — Yusef Ahmed
(74) *Attorney, Agent, or Firm* — K&L Gates LLP (57) ABSTRACT

The present disclosure relates to a compensation circuit for independently controlling turn-on and turn-off of a power electronic switch through a gate driver. The compensation circuit includes a circuit path sampling a first portion of a voltage induced across an inductance of the power electronic switch at turn-on. Another circuit path samples a second portion of the voltage induced across the inductance of the
(Continued)

power electronic switch at turn-off. The compensation circuit further includes a gate driver reference connection configured to respectively supply the sampled portions of the voltage during turn-on and turn-off of the power electronic switch. A compensation circuit controlling a first power electronic switch in parallel with a second power electronic switch, a commutation cell and a power converter having a pair of parallel legs, in which each power electronic switch is provided with the compensation circuit, are also disclosed.

19 Claims, 7 Drawing Sheets

(51) Int. Cl.
*H03K 17/082* (2006.01)
*H03K 17/16* (2006.01)
*H02M 3/155* (2006.01)
*H02M 3/335* (2006.01)
*H02M 7/537* (2006.01)
*H02M 1/00* (2006.01)

(52) U.S. Cl.
CPC ......... *H03K 17/165* (2013.01); *H03K 17/168* (2013.01); *H02M 3/155* (2013.01); *H02M 3/335* (2013.01); *H02M 7/537* (2013.01); *H02M 2001/0009* (2013.01); *H02M 2001/0058* (2013.01); *H03K 2217/0027* (2013.01); *Y02B 70/1491* (2013.01)

(56) References Cited

U.S. PATENT DOCUMENTS

| | | | | |
|---|---|---|---|---|
| 6,204,717 | B1* | 3/2001 | Nagasu | H01L 29/0692 257/E29.026 |
| 6,275,399 | B1* | 8/2001 | Miyazaki | H03K 17/165 363/132 |
| 2003/0063482 | A1* | 4/2003 | Carsten | H02M 1/08 363/89 |
| 2003/0107905 | A1* | 6/2003 | Miura | H01L 29/7803 363/41 |
| 2006/0126253 | A1* | 6/2006 | Urakabe | H02M 1/38 361/118 |
| 2009/0295456 | A1* | 12/2009 | Nakamura | H03K 17/6877 327/434 |
| 2009/0296291 | A1* | 12/2009 | Volke | H03K 17/0822 361/56 |
| 2010/0013403 | A1* | 1/2010 | Fischer | H05B 41/28 315/291 |
| 2011/0210675 | A1* | 9/2011 | Hamamoto | F21S 8/031 315/185 R |
| 2011/0273206 | A1* | 11/2011 | Lee | H02M 1/08 327/109 |
| 2012/0235663 | A1* | 9/2012 | Bayerer | H02M 1/088 323/311 |
| 2013/0181750 | A1* | 7/2013 | Lobsiger | H03K 17/08148 327/109 |
| 2013/0285712 | A1* | 10/2013 | Kanschat | H03K 17/00 327/109 |
| 2014/0321178 | A1* | 10/2014 | Cyr | H02M 1/08 363/131 |
| 2014/0375362 | A1* | 12/2014 | Lobsiger | H03K 17/00 327/109 |
| 2015/0162902 | A1* | 6/2015 | Lizama | H03K 17/082 327/376 |
| 2015/0222202 | A1* | 8/2015 | Cyr | H03K 17/0828 363/131 |
| 2015/0326222 | A1* | 11/2015 | Niemi | H03K 17/687 327/427 |
| 2016/0043711 | A1* | 2/2016 | Cyr | H02M 1/32 318/400.22 |
| 2016/0134279 | A1* | 5/2016 | Sicard | H03K 17/687 327/109 |

FOREIGN PATENT DOCUMENTS

| | | |
|---|---|---|
| WO | 2014161080 | 10/2014 |
| WO | 2015061901 | 5/2015 |
| WO | 2015070347 | 5/2015 |

OTHER PUBLICATIONS

Cyr et al., "Reducing switching losses and increasing IGBT drive efficiency with ReflexTM gate driver technology," TM4 Inc., Decielec, Tarbes, France, 12 pages, published on Apr. 23, 2013.
Dulau et al., "A New Gate Driver Integrated Circuit for IGBT Devices with Advanced Protections," IEEE Transactions on Power Electronics, vol. 21, No. 1, pp. 38-44, Jan. 2006.
PCT International Search Report for International Patent Application No. PCT/CA2014/051065, mailed Jan. 22, 2015, 3 pages.
PCT Written Opinion of International Searching Authority for International Patent Application No. PCT/CA2014/051065 mailed Jan. 22, 2015, 4 pages.

\* cited by examiner

PRIOR ART

Figure 1

PRIOR ART

COMPENSATION CIRCUIT, COMMUTATION CELL AND POWER CONVERTER CONTROLLING TURN-ON AND TURN-OFF OF A POWER ELECTRONIC SWITCH

CROSS REFERENCE TO RELATED APPLICATIONS

This application is a national phase under 35 U.S.C. §371 of International Patent Application No. PCT/CA2014/051065 filed on Nov. 6, 2014 which claims priority to and the benefit of U.S. Provisional Patent Application No. 61/904,045 filed on Nov. 14, 2013 and the entirety of which application is incorporated by reference herein.

TECHNICAL FIELD

The present disclosure relates to the field of power electronics. More specifically, the present disclosure relates to a compensation circuit, a commutation cell and a power converter controlling turn-on and turn-off of a power electronic switch.

BACKGROUND

Commutation cells are commonly used in electronic systems that require conversion of a voltage source including both DC-DC converters and DC-AC converters, which are often called inverters. With the limited space allowed for power converter circuits, such as those used for example in electric and/or electric hybrid automotive applications and given the high cost of the semi-conductors, the demand for integration of these commutation cells increases.

A known way of reducing the space occupied by semi-conductors in power converter circuits is to increase their efficiency to thereby allow the size of their cooling surface to be reduced.

Losses in power electronic switches present in conventional power converter circuits are mainly caused by two sources; conduction losses and switching losses. One way to reduce switching losses is generally by accelerating the turn-on and turn-off of the power electronic switches. However, fast turn-off of the power electronic switches generates overvoltage in parasitic (stray) inductances of their high-frequency loop. It is thus often required to slow down turning off of the power electronic switches to protect them against overvoltage. This may seriously impact the overall efficiency of conventional power converter circuits.

Figure 1:
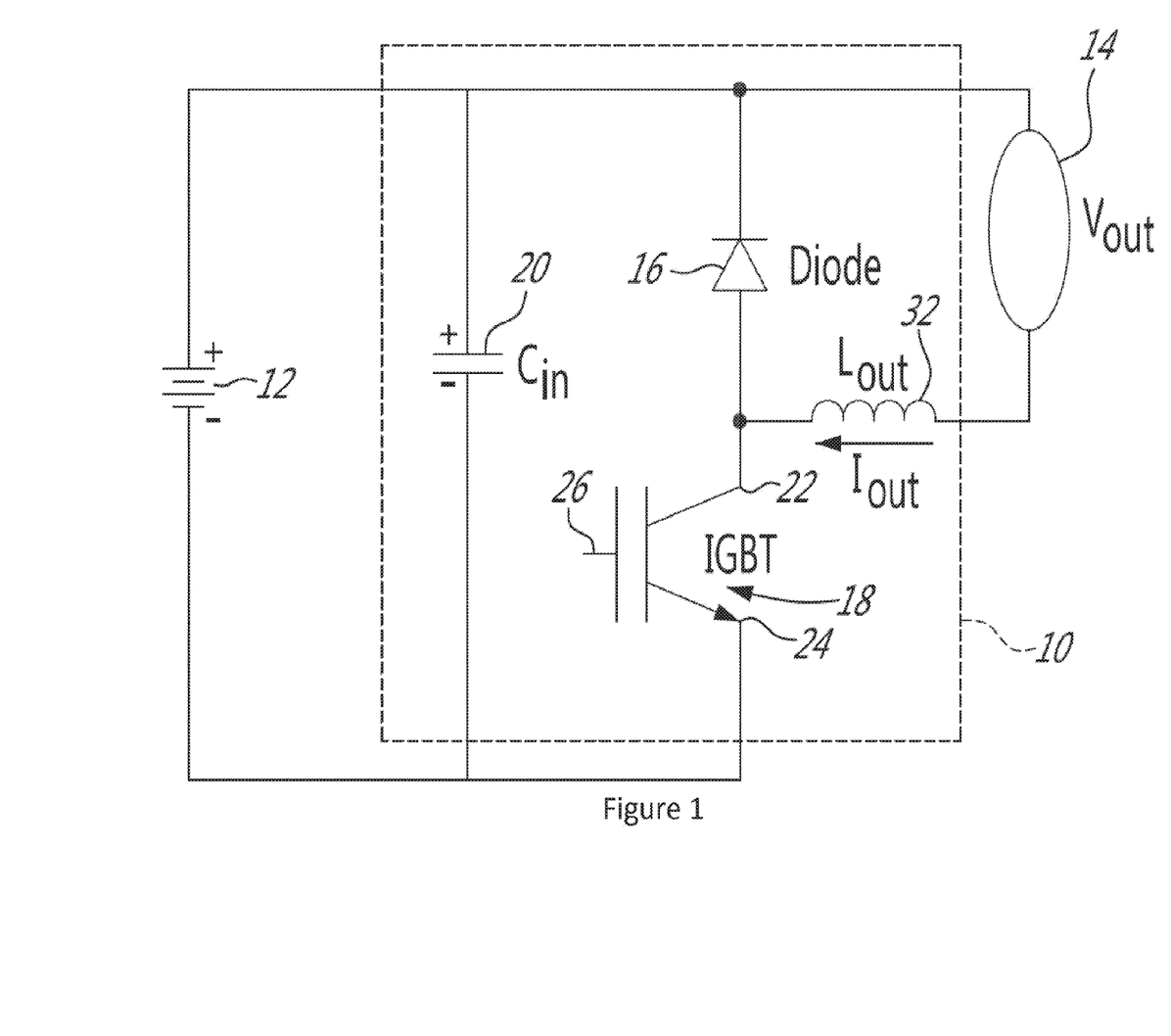
FIG. 1 is an idealized circuit diagram of a conventional commutation cell such as those used in conventional power converter circuits.

FIG. 1 is an idealized circuit diagram of a conventional commutation cell such as those used in conventional power converter circuits. A commutation cell 10 converts a DC voltage $V_{bus}$ from a voltage source 12 (or from a capacitor) into a current source $I_{out}$ (or into an inductance) that usually generates a voltage $V_{out}$ appropriate for a load 14, which may be a resistive load an electric motor and the like. The commutation cell 10 comprises a freewheel diode 16 and a controlled power electronic switch 18, for example an isolated gate bipolar transistor (IGBT). A capacitor 20 ($C_{in}$) is used to limit variations of the voltage $V_{bus}$ of the voltage source 12 and an inductance 32 is used to limit the variations of the output current $I_{out}$. A gate driver (not shown in FIG. 1 but shown on later Figures) controls turning on and off of the power electronic switch 18. FIG. 1 illustrates a configuration of the commutation cell 10 of the load 14 and of the voltage source 12, in which energy flows from the voltage source 12 to the load 14, i.e. from left to right on the drawing. The commutation cell 10 can also be used in a reverse configuration in which energy flows in the opposite direction.

When turned on, the power electronic switch 18 allows current to pass therethrough, from its collector 22 to its emitter 24; at that time, the power electronic switch 18 can be approximated as a closed circuit. When turned off, the power electronic switch 18 does not allow current to pass therethrough and becomes an open circuit.

The gate driver applies a variable control voltage between the gate 26 and the emitter 24 of the power electronic switch 18. For some types of power electronic switches such as bipolar transistors, the gate driver may act as a current source instead of as a voltage source. Generally, when the voltage applied between the gate 26 and the emitter 24 is "high" the power electronic switch 18 allows passing of current from the collector 22 to the emitter 24. When the voltage applied between the gate 26 and the emitter 24 is "low" the power electronic switch 18 blocks passage of current therethrough. In more details, a voltage difference between the gate 26 and the emitter 24, denoted $V_{ge}$, is controlled by the gate driver. When $V_{ge}$ is greater than a threshold $V_{ge(th)}$ for the power electronic switch 18, the switch 18 is turned on and a voltage $V_{ce}$ between the collector 22 and the emitter 24 becomes near zero. When $V_{ge}$ is lower than $V_{ge(th)}$, the power electronic switch 18 is turned off and $V_{ce}$ eventually reaches $V_{bus}$.

When the power electronic switch 18 is turned on, a current $I_{out}$ flows from the voltage source 12 (and transiently from the capacitor 20) through the load 14 and through the collector 22 and the emitter 24. When the power electronic switch 18 is turned off, the current $I_{out}$ circulates from the load 14 and passes in the freewheel diode 16. It may thus be observed that the power electronic switch 18 and the freewheel diode 16 operate in tandem. Turning on and off of the power electronic switch 18 at a high frequency allows the current $I_{out}$, in the output inductance $L_{out}$ 32, to remain fairly constant.

It should be observed that, in the case of other power electronic switch types for example bipolar transistors, the term "gate" may be replaced with "base", the base being controlled by a current as opposed to the gate that is controlled by a voltage. These distinctions do not change the overall operation principles of the commutation cell 10.

Figure 2:
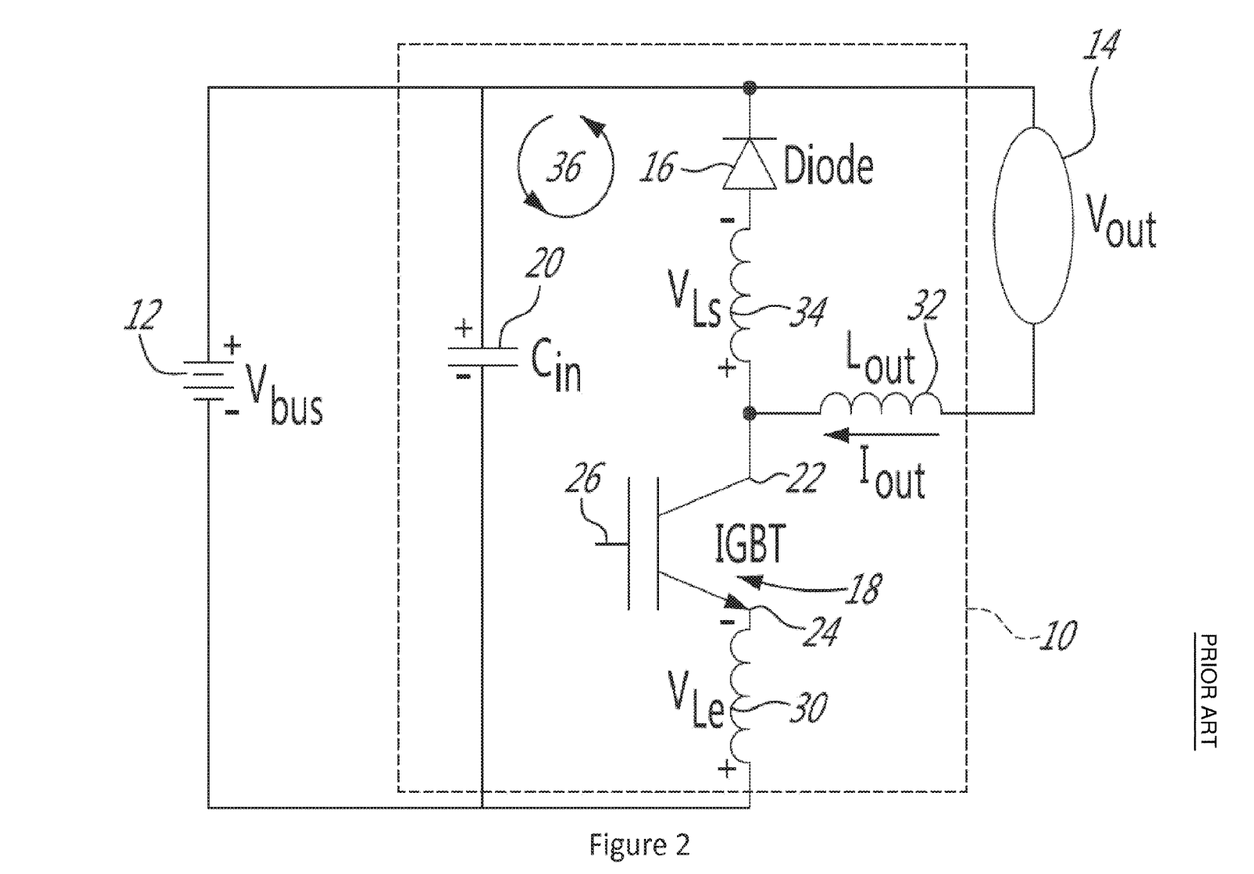
FIG. 2 is another circuit diagram of the conventional commutation cell of FIG. 1 showing parasitic (stray) inductances.

FIG. 2 is another circuit diagram of the conventional commutation cell of FIG. 1, showing parasitic (stray) inductances. In contrast with the idealized model of FIG. 1, connections between components of an actual commutation cell define parasitic inductances. Though the parasitic inductances are distributed at various places within the commutation cell 10, a suitable model presented in FIG. 2 shows two (2) distinct inductances representing the overall parasitic inductance including an emitter inductance 30 of the power electronic switch 18 and an inductance 34 representative of all other parasitic inductances (other than the emitter inductance 30) around a high frequency loop 36 formed by the freewheel diode 16, the power electronic switch 18 and the capacitor 20. The high frequency loop 36 is a path where current changes significantly upon switching of the power electronic switch 18. It should be noted that an output inductance $L_{out}$ 32 is not part of the high frequency loop because its current remains fairly constant through the commutation period.

Figure 3:
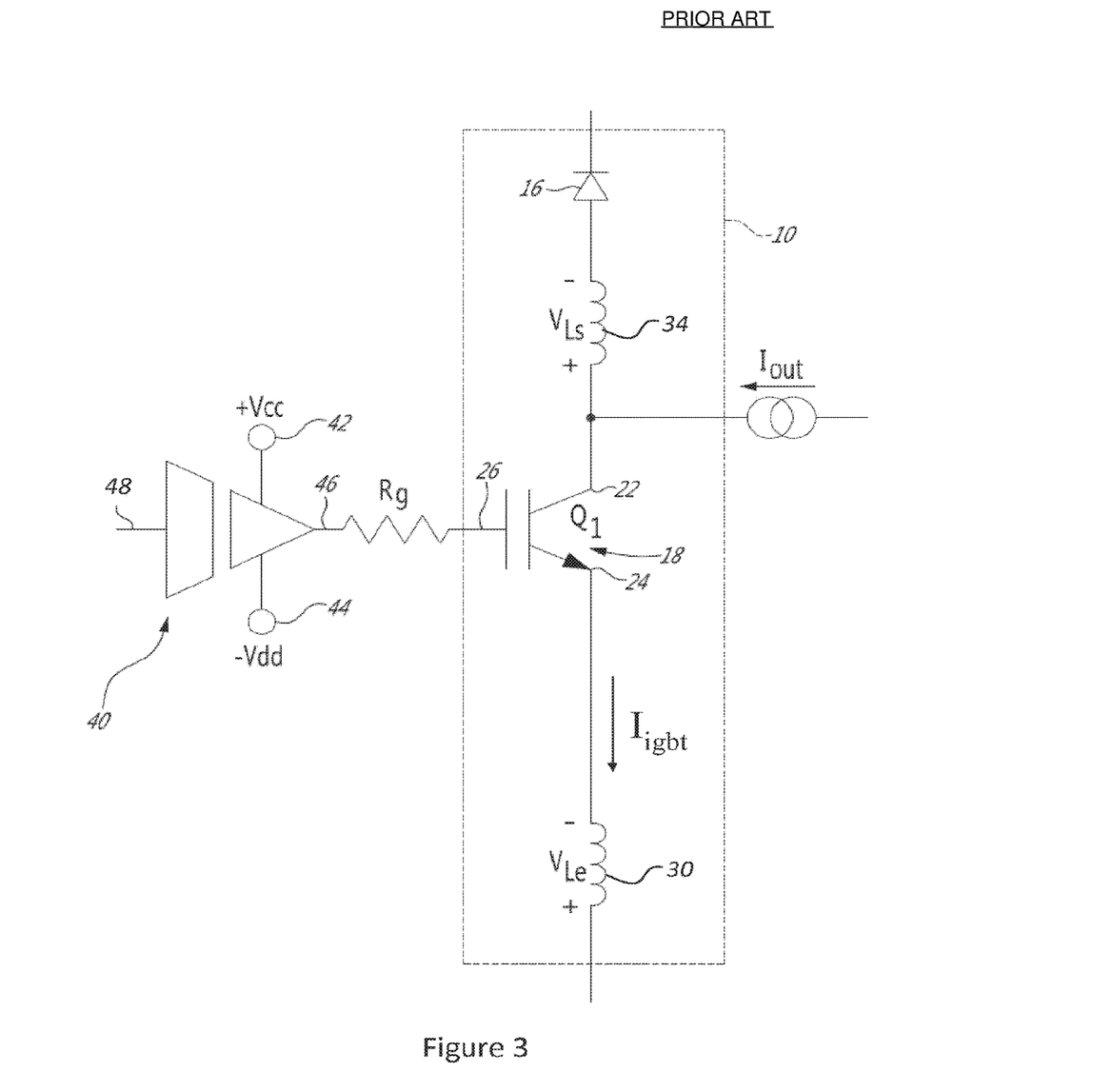
FIG. 3 is a circuit diagram of a conventional commutation cell further showing a gate driver.

FIG. 3 is a circuit diagram of a conventional commutation cell further showing a gate driver 40. Some elements of the commutation cell 10 are not shown on FIG. 3 in order to simply the illustration. FIG. 3 further shows a gate driver 40 having a positive supply voltage 42 and a negative supply voltage 44, an output 46 of the gate driver 40 being connected to the gate 26 of the power electronic switch 18 via a gate resistor $R_g$. The positive supply voltage 42 of the gate driver 40 has a value denoted $+V_{cc}$ while the negative supply voltage 44 has value denoted $-V_{dd}$. An input 48 of the gate driver 40 is connected to a controller (not shown) of the commutation cell 10, as is well known in the art. A voltage at the output 46 of the gate driver 40 goes up to $+V_{cc}$ and goes down to $-V_{dd}$ in order to control the voltage at the gate 26. The input resistance of the gate 26 to emitter may be very high, especially in the case of an IGBT. However, a parasitic Miller capacitance present between the gate 26 and the emitter 24, causes some current to flow from the output 46 when the gate driver 40 alternates between $+V_{cc}$ and $-V_{dd}$. The value $R_g$ of the gate resistor is selected as a function of the parasitic Miller capacitance and of a desired switching rate of the power electronic switch 18 so that the voltage at the gate 26 changes at rate appropriate for the desired switching rate.

On FIG. 3, a current $I_{igbt}$ flowing through the power electronic switch 18 and through the emitter parasitic inductance 30 is essentially equal to $I_{out}$ when the power electronic switch 18 is turned on and quickly reduces to zero (substantially) when the power electronic switch 18 turns off.

When the power electronic switch 18 turns on or off the current $I_{igbt}$ flowing therethrough increases or diminishes at a fast rate. These variations of $I_{igbt}$, denoted di/dt, generate voltage across inductances 30 and 34, according to the well-known equation (1):

$$V_L = L \cdot \frac{di}{dt} \quad (1)$$

wherein $V_L$ is a voltage induced across an inductance and L is an inductance value.

A voltage $V_{Ls}$ is generated across the parasitic inductance 34 and a voltage $V_{Le}$ is generated across the emitter parasitic inductance 30. On FIGS. 2 and 3, the polarities shown across the high frequency loop inductance 34, including the emitter inductance 30 reflect voltages obtained upon turn-off of the power electronic switch 18 when the $I_{igbt}$ current diminishes very rapidly, di/dt thus taking a negative value. Upon turn-on of the power electronic switch 18 voltages across the high frequency loop inductance 34, including the emitter inductance 30 are in the opposite direction.

These voltages $V_{Ls}$ and $V_{Le}$ are in series with $V_{bus}$ from the voltage source 12. When the power electronic switch 18 turns off the collector 22 to emitter 24 voltage increases until the freewheel diode 16 turns on. At that time addition of $V_{bus}$, $V_{Ls}$ and $V_{Le}$ results in an important overvoltage applied between the collector 22 and the emitter 24 of the power electronic switch 18. Though power electronic switches are rated for operation at some level of voltage, extreme overvoltage can reduce the lifetime of any power electronic switch to thereby lead to its premature failure or even break the device.

Figure 4:
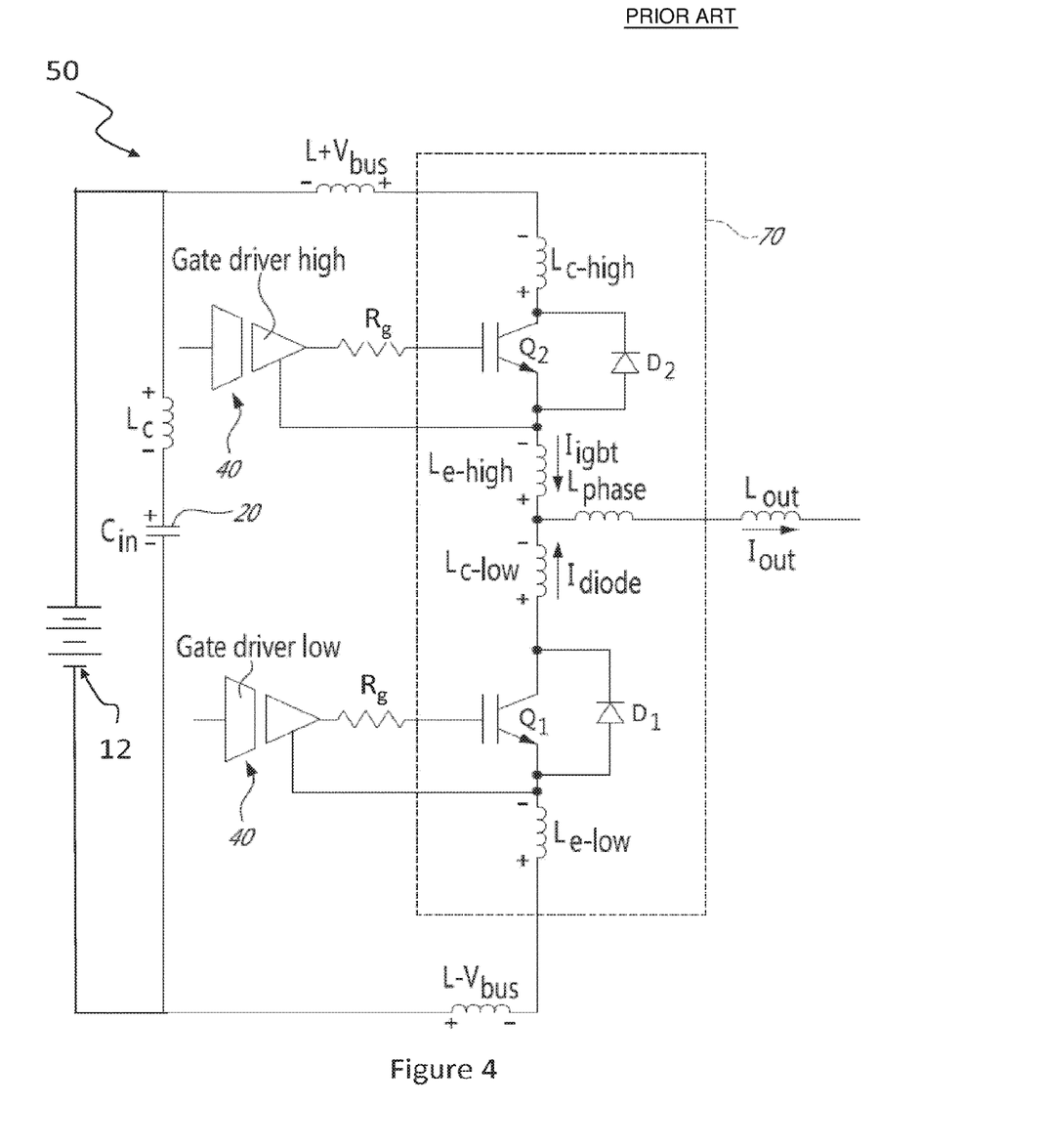
FIG. 4 is a circuit diagram of a conventional IGBT leg formed of two conventional commutation cells.

FIG. 4 is a circuit diagram of a conventional IGBT leg formed of two conventional commutation cells. Two commutation cells 10 introduced in the above description of FIGS. 1-3, in which IGBTs are used as power electronic switches 18 in the example of FIG. 4 are connected in a single loop to form an IGBT leg 70 of a power converter 50. A first power electronic switch (bottom IGBT $Q_1$) operates in tandem with a first freewheel diode (top freewheel diode $D_2$) and a second power electronic switch (top IGBT $Q_2$) operates in tandem with another freewheel diode (bottom freewheel diode $D_1$). Each IGBT has its own gate driver 40. A voltage source 12 provides a voltage $V_{bus}$ in parallel to an input capacitance 20 ($C_{in}$) connected to the IGBT leg 70 via a parasitic inductance $L_c$. Parasitic inductances inherently provided in wires connections decoupling capacitor and circuit board traces of a power converter have been represented in FIG. 4. A three-phase power converter used for powering a three-phase electric motor (not shown) from a battery such as 12, would comprise three (3) IGBT legs 70 as shown on FIG. 4. Since such three-phase power converters are believed well-known they are not described in further details herein.

As can be seen from FIG. 4, a reference of each gate driver is connected to the emitter of the IGBT $Q_1$ and $Q_2$, typically known as logical pins of the IGBTs $Q_1$ and $Q_2$. For concision purpose a description of FIG. 4 focuses on its bottom portion including the bottom IGBT $Q_1$.

The overvoltage effect on a power electronic switch 18 discussed in the above description of FIGS. 2 and 3, also applies to the IGBTs $Q_1$ and $Q_2$.

When the bottom IGBT $Q_1$ is turned off current transits from the bottom IGBT $Q_1$ to the top freewheel diode $D_2$, during an overvoltage period. A properly selected IGBT is able to support the overvoltage created by a current variation (di/dt) across various parasitic inductances ($L_c$, $L_{+Vbus}$, $L_{c\text{-}high}$, $L_{e\text{-}high}$, $L_{c\text{-}low}$, $L_{e\text{-}low}$ and $L_{-Vbus}$) present in the IGBT leg 70. Indeed, since the inductances resist change of current therein, additive voltages develop in the IGBT leg 70 as illustrated by the polarities of the parasitic inductances shown on in FIG. 4. These voltages, added to the voltage $V_{bus}$ of the source, often result in a voltage exceeding the maximal collector to emitter voltage $V_{ce}$ rating of the bottom IGBT $Q_1$. The top IGBT $Q_2$ is subject to the same problem.

Solutions exist that tend to limit overvoltage in power electronic switches by slowing down the slope of the gate-emitter voltage. However excessive limitation of the overvoltage can imply longer switching times of the current, reducing commutation cell performance.

Also, the commutation cell 10 and the power converter 50 can deliver their maximum power when operating at high bus voltages $V_{bus}$. Current solutions to limit the overvoltage generated across the parasitic inductances of the high frequency loop 36 allow using bus voltages approaching the maximum voltage rating of the power electronic switches 18. However, bus voltages may vary over time or between different applications. For those reasons, overvoltage protection in conventional commutation cells generally need to be overdesigned, as a safety measure. As such, conventional commutation cells operate at less than their maximum attainable power output.

Numerous additional problems related to dynamic current sharing arise from parallelization of commutation cells particularly when placing IGBT legs in parallel. For example should one of a pair of parallelized power electronic switch transition being states faster than the other of the same pair this fastest switch supports more current than the others and therefore generates more heat. This often leads to premature ageing of some of the parallelized power electronic switches, leading to the premature end of life of power converters.

Conventionally, to overcome such dynamic unbalance problems, some rules are followed. A first rule suggests using a matching gate driver circuit for each power electronic switch, in which gate drivers having equal gate resistors as well as gate loop inductance are used to minimize the delays between the switching times of all the power electronic switches. According to a second rules, power electronic switches to be placed in parallel are selected so that they have matched intrinsic parameters such as parasitic capacitances, threshold voltage and gain. Selection of matched power electronic switches may be made by using switches manufactured in a same batch. Finally, a third rule suggests using identical circuit layouts in the high frequency loop for every power electronic switch.

It is often particularly difficult to fulfill this third rule, in many applications, since common power electronic switch have their own power circuit paths. Also, when placing discrete switches in parallel, it is not always possible to match each of their power circuit branches because of mechanical and packaging imperatives.

Therefore, there is a need for circuits capable of compensating for variable characteristics of power electronic switches.

SUMMARY

According to the present disclosure there is provided a compensation circuit for independently controlling turn-on and turn-off of a power electronic switch through a gate driver. The compensation circuit includes a first circuit path configured to sample a first portion of a voltage induced across an inductance of the power electronic switch at turn-on of the power electronic switch. Also included is a second circuit path configured to sample a second portion of the voltage induced across the inductance of the power electronic switch at turn-off of the power electronic switch. The compensation circuit further includes a gate driver reference connection configured to respectively supply the first and second portions of the voltage during turn-on and turn-off of the power electronic switch.

The present disclosure also relates to a compensation circuit for independently controlling turn-on and turn-off of a first power electronic switch that is placed in parallel with a second power electronic switch, the control being done through a gate driver. The compensation circuit includes a first circuit path configured to sample a first portion of a voltage induced across an inductance of the first power electronic switch at turn-on of the first power electronic switch. Also included is a second circuit path configured to sample a second portion of the voltage induced across the inductance of the first power electronic switch at turn-off of the first power electronic switch. The compensation circuit further includes a gate driver reference connection configured to respectively supply the first and second portions of the voltage during turn-on and turn-off of the first power electronic switch.

According to the present disclosure there is also provided a commutation cell configured for limiting switching overvoltage. The commutation cell comprises a power electronic switch having a parasitic inductance through which a voltage is generated upon turning on and off of the power electronic switch and the compensation, which is connected to the parasitic inductance.

The present disclosure further relates to a power converter comprising a pair of parallel legs, each leg having a pair of power electronic switches connected in series, each power electronic switch being provided with one of the compensation circuits.

The present disclosure also relates to a power converter comprising a pair of parallel legs, each leg connecting in series a pair of the commutation cells that include the compensation circuit.

The foregoing and other features will become more apparent upon reading of the following non-restrictive description of illustrative embodiments thereof, given by way of example only with reference to the accompanying drawings.

BRIEF DESCRIPTION OF THE DRAWINGS

Embodiments of the disclosure will be described by way of example only with reference to the accompanying drawings, in which.

Like numerals represent like features on the various drawings.

DETAILED DESCRIPTION

Various aspects of the present disclosure generally address one or more of the problems related to variable characteristics of power electronic switches.

Circuits operable to limit overvoltage in commutation cells, especially at turn-off of IGBTs, are described in international patent publication no WO 2013/082705 A1, in international patent application no PCT/CA2013/000805, in U.S. provisional applications No. 61/808,254, No. 61/898, 502, No. 61/904,038, No. 61/905,045, and No. 61/904,050, and in "Reducing switching losses and increasing IGBT drive efficiency with Reflex™ gate driver technology", available at http://www.advbe.com/docs/DeciElec2013-Jean Marc Cyr-TM4.pdf, all of which are authored by Jean-Marc Cyr et al. the disclosure of these being incorporated by reference herein.

The present technology provides control of overvoltage and switching losses at turn-off and turn-on of a power electronic switch of a commutation cell. Circuits and methods presented herein are generally compatible with other solutions to limit overvoltage at turn-off and/or turn-on of parallelized power electronic switches. Without limitation, the disclosed technology may be used in a single commutation cell, in a leg having two (2) cascaded commutation cells, and in parallelized legs.

In a commutation cell, di/dt at turn-off of a power electronic switch generates a voltage across parasitic (stray) inductances of a high frequency loop of the commutation cell. This voltage is applied across the power electronic switch in addition to a bus voltage providing power to the commutation cell. A solution based on the injection of a sample of the overvoltage present across the power electronic switch to a gate driver of the power electronic switch has been proposed. A commutation cell built according to the present disclosure comprises a pair of circuit paths that respectively select a different portion of a voltage induced across an inductance of a power electronic switch at turn-on and at turn-off of the power electronic switch so that these portions are selectively applied to control the turn-on and turn-off of the power electronic switch.

The techniques disclosed herein will mainly be described in relation to power converters including pairs of commutation cells forming IGBT legs, a pair of IGBT legs being further placed in parallel for high power applications. The same teachings are however applicable to single commutation cells or to single IGBT legs. Additionally, the following description will mainly relate to the use of isolated gate bipolar transistors (IGBT). Mentions of IGBTs in the following description are made for illustration purposes and are not meant to limit the present disclosure. The same techniques may equally be applied to commutation cells constructed using metal-oxide-semiconductor field-effect transistors (MOSFET), bipolar transistors and like power electronic switches.

Generally stated, the disclosed compensation circuit facilitates parallel operation of power electronic switches described herein by the reduction of dynamic unbalance between parallelized power electronic switches having distinct characteristics. This is accomplished by balancing the switched currents at turn-on and turn-off. A compensation circuit is provided to inject a feedback of a drop voltage across the parasitic inductance of the high frequency loop of each individual power electronic switch to its respective gate driver circuit. This allows to selectively adjust the speed at turn-on and turn-off of the parallelized switches. This compensation circuit separately adjusts the current variation (di/dt) in the commutation cell by dynamically decreasing a voltage applied at the gate of the power electronic switch during the turn-on and by increasing it during turn-off. Of course, the disclosed compensation circuit may be used in single power electronic switch configurations, or in single leg configurations as it offers an alternative solution to the general problem of overvoltage control during switching.

Figure 5:
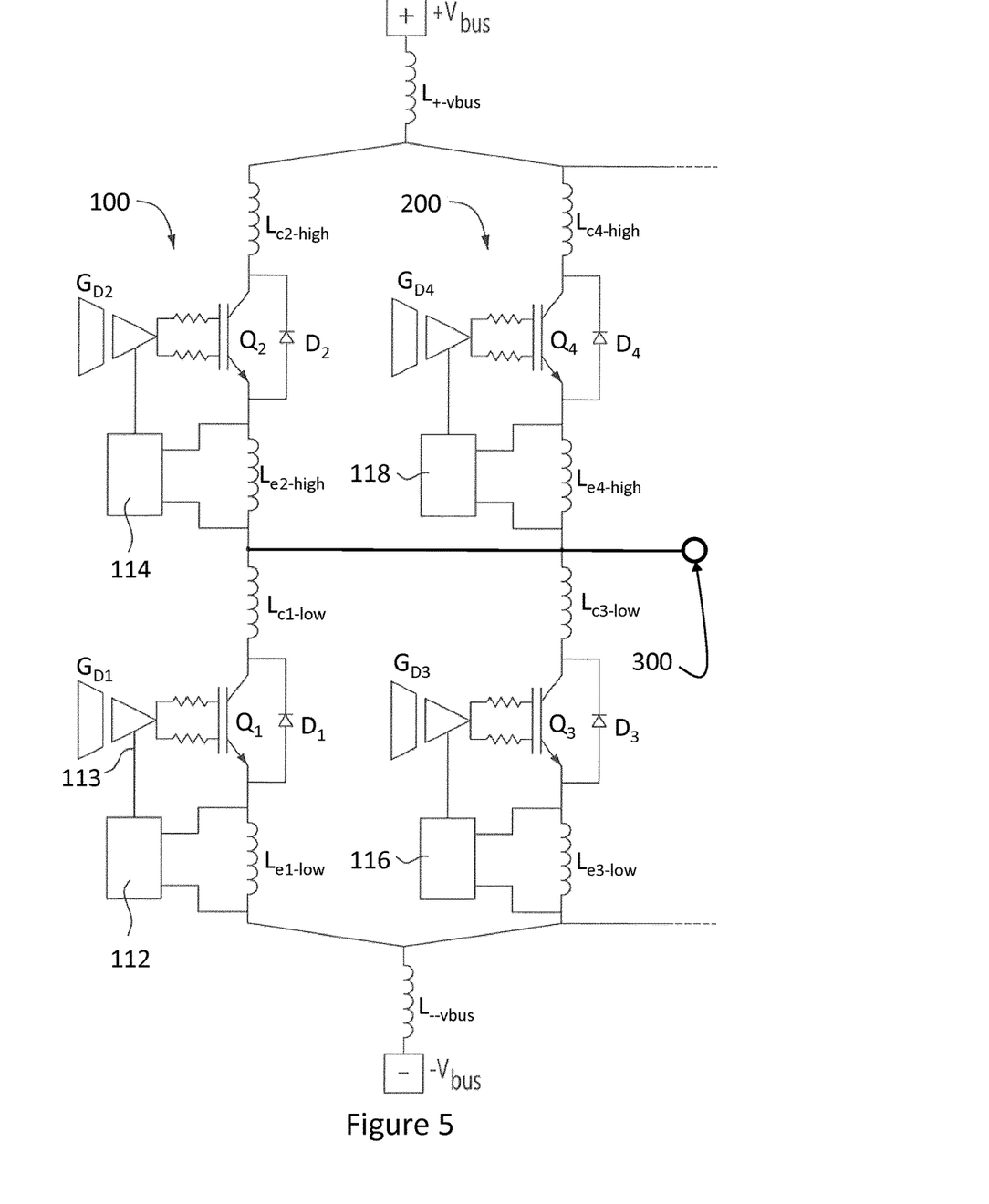
FIG. 5 is a circuit diagram of a power converter including two parallelized IGBT legs.

FIG. 5 is a circuit diagram of a power converter including two parallelized IGBT legs. FIG. 5 also illustrates the parasitic inductances caused by the components interconnections as well as individual feedback loops to the gate driver of each power electronic switch. In the example of FIG. 5 the two legs could be constructed from discrete parts or from switches of a same module or of different modules. In the context of the present disclosure, a 'module' is a package containing chips including several IGBTs and diodes made from a common wafer. The two parallelized switches could be also discrete parts to be parallelized to increase the available phase current at the output.

The first leg 100 includes a bottom IGBT $Q_1$, its associated freewheel diode $D_2$ and parasite inductances $L_{c1-low}$ and $L_{e1-low}$, as well as a top IGBT $Q_2$, its associated diode freewheel $D_1$ and parasite inductances $L_{c2-high}$ and $L_{e2-high}$. First and second gate drivers $G_{D1}$ and $G_{D2}$ are respectively associated with the gate of the bottom and top IGBTs $Q_1$ and $Q_2$. The gate drivers $G_{D1}$ and $G_{D2}$ receive signals from a controller (not shown) and turn-on or off their connected IGBTs $Q_1$ and $Q_2$. Gate driver references (return path) of each gate driver $G_{D1}$ and $G_{D2}$ are respectively connected to compensation circuits 112 and 114 that are also connected across the parasitic emitter inductances $L_{e1-low}$ and $L_{e2-high}$ of their respective IGBTs $Q_1$ and $Q_2$.

A second leg 200 includes bottom and top IGBTs $Q_3$ and $Q_4$ and corresponding freewheel diodes $D_3$ and $D_4$. Both top IGBTs $Q_2$ and $Q_4$ are turned on in parallel (at the same time) by respective gate drivers $G_{D2}$ and $G_{D4}$ connected to respective compensation circuits 114 and 118, to provide current from a positive $V_{bus}$ tab to a load connected to a port 300, the load being for example one phase of a three-phase motor. Both top IGBTs $Q_2$ and $Q_4$ are turned off in parallel while both bottom IGBTs $Q_1$ and $Q_3$ are turned on by respective gate drivers $G_{D1}$ and $G_{D3}$ to provide current path from the load to the negative $V_{bus}$ tab.

The second leg 200 is identical to the first leg 100 and will not be further described herein. It may be observed that additional legs may be used in parallel to the first and second legs 100 and 200, if it is desired to provide even more power to the load connected to the port 300. A number of parallel legs will be selected according to the power requirements of the load and according to the power ratings of the IGBTs in the power converter.

When the IGBTs $Q_2$ and $Q_4$ are turned on or off, the rate of change of current (di/dt) is higher in the one of the legs 100 or 200 that has a lower total parasitic inductance, assuming that the respective gate circuits of the IGBTs $Q_2$ and $Q_4$ provide similar timing in terms of minimal delay and like gate circuit parameters. For example, if a sum of $L_{e1-low}+L_{c1-low}+L_{e2-high}+L_{c2-high}$ is lower than a sum of $L_{e3-low}+L_{c3-low}+L_{e4-high}+L_{c4-high}$, the lower total inductance in the leg 100 opposes less resistance to the di/dt. In that case, the IGBT $Q_2$ commutates higher current than the IGBT $Q_4$, therefore dissipating more losses at turn-on. In such a case the IGBT $Q_2$ may be expected to suffer from higher thermal stress than the IGBT $Q_4$.

When the IGBT $Q_2$ and $Q_4$ are turned off, they must be able to withstand the overvoltage created by the di/dt across the various parasitic inductances, including $L_{-Vbus}$, $L_{e1-low}$, $L_{c1-low}$, $L_{e2-high}$, $L_{c2-high}$ and $L_{+Vbus}$ for $Q_2$ and $L_{-Vbus}$, $L_{e3-low}$, $L_{c3-low}$, $L_{e4-high}$, $L_{c4-high}$ and $L_{+Vbus}$ for $Q_4$ that are respectively present in legs 100 and 200 of the power converter. Indeed, since the inductances resist change of current therein, additive voltages develop in the circuit of each leg 100 and 200. For reliability reasons these voltages added to the voltage between the positive and negative $V_{bus}$ tabs must be kept below the maximum rating voltage of each IGBT. Different turn-off di/dt between the IGBTs $Q_2$ and $Q_4$ creates different voltage overshoots as well as unbalance in turn-off losses.

Generally stated, by adding a compensation circuit connected to the gate driver of each power electronic switch, in the present case in the gate drivers of the IGBTs, samples of the voltage induced in the parasitic emitter inductance each IGBT are fed back in the gate driver to control rate of change of the current (di/dt) passing through the IGBT both during turn-on and turn-off, independently for each IGBT.

A controlled portion of the voltage across the parasitic emitter inductance of each IGBT is thus injected in the gate driver to create a negative voltage (feedback) from the power circuit to the gate circuit of the IGBT, resulting in slowing down a variation of the gate-emitter voltage ($V_{ge}$). The outcome is a direct action on the gate voltage without significantly causing delay or additional gate current.

Figure 6:
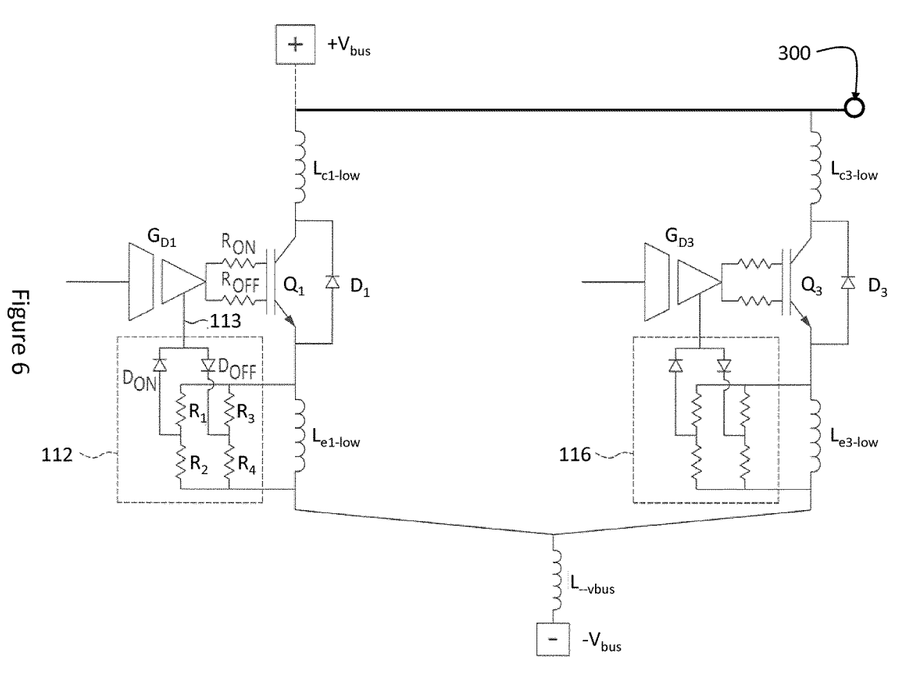
FIG. 6 is a detailed view of a portion of FIG. 5 illustrating a compensation circuit according to a first illustrative embodiment.

Because there is no optimal emitter inductance between the logical and power connections of the emitter in a conventional commercial IGBT module, a compensation circuit has been developed to optimize the sample of the voltage injected in the gate drive circuit separately during the turn-on and turn-off phases. FIG. 6 is a detailed view of a portion of FIG. 5 illustrating a compensation circuit according to a first illustrative embodiment. FIG. 6 shows the bottom portion of the parallelized legs 100 and 200 with an embodiment of the compensation circuit 112.

For concision purpose, only the compensation circuit 112 and its connection to the IGBT $Q_1$ and its gate drive $G_{D1}$ will be described in detail hereinbelow; it is to be understood that the compensation circuits 114, 116 and 118 are similarly constructed.

As shown on FIG. 6 the compensation circuit 112 includes a turn-on resistive divider circuit comprising resistors $R_1$ and $R_2$ connected in series and across the parasitic inductance $L_{e1-low}$. A diode $D_{on}$ interconnects a junction of the resistors $R_1$ and $R_2$ to a reference 113 of the gate driver $G_{D1}$.

Similarly, the compensation circuit 112 includes a turn-off resistive divider circuit comprising resistors $R_3$ and $R_4$ connected in series and across the parasitic inductance $L_{e1-low}$. A diode $D_{off}$ interconnects a junction of the resistors $R_3$ and $R_4$ to the reference 113 of the gate driver $G_{D1}$.

The turn-on and turn-off resistive divider circuits allow a separate adjustment of a level of the induced voltage that is fed back to the gate driver $G_{D1}$. Upon turn-off of the IGBT $Q_1$ a negative variation of the current passing through $Q_1$ causes a drop voltage across the parasitic inductance (this will be best understood by reference to FIG. 2, which shows the polarity of the voltage generated on the parasitic emitter inductance at turn-off). The emitter voltage is lower than voltage at the reference 113. The turn-off diode $D_{on}$ is at that time non-conductive while the turn-off diode $D_{off}$ becomes conductive. The opposite is true at turn-on of the IGBT $Q_1$. The turn-on and turn-off diodes $D_{on}$ and $D_{off}$ therefore ensure that the correct resistive divider is used at the appropriate switching phases of the IGBT $Q_1$.

It is to be noted that the gate drivers have separate control for the turn-on and the turn-off of the gate of their respective power electronic switches. Accordingly gate resistors $R_{on}$ and $R_{off}$ interconnect the output of the gate driver $G_{D1}$ and the gate of the IGBT $Q_1$ playing the role of the gate resistor $R_g$ of FIGS. 3 and 4 at the distinct switching phases. Increasing values of the gate resistors $R_{on}$ and $R_{off}$ slows down the rate of change of the current at turn-on and turn-off while decreasing their values speeds up this rate of change at turn-on and turn-off. This is open loop action does not take into account the differences in parasitic inductances of the power circuit that has a great impact on the commutation.

Accordingly, for the turn-off the ratio of $R_3$ over $R_4$ combined with $R_{off}$ sets the rate of current fall in the IGBT $Q_1$. The values of the two gate resistors $R_3$ and $R_4$ determine the feedback portion of the voltage sampled across the parasitic emitter inductance that is injected in the gate circuit of the IGBT $Q_1$. Values of gate resistors are adjusted to control the turn-off loss, thereby controlling the thermal stress on the IGBT $Q_1$ and keeping the overvoltage on the IGBT $Q_1$ below its maximum rating.

For the turn-on, the ratio of $R_1$ over $R_2$ combined with $R_{on}$ sets the current rise rate the IGBT $Q_1$. The values of the gate two resistors $R_1$ and $R_2$, determine the feedback portion of the voltage sampled across the parasitic emitter inductance that is injected in the gate circuit of the IGBT $Q_1$. Values of these resistors and of the corresponding resistors of the compensation circuit 116 are adjusted to balance the turn-on losses between the parallelized IGBTs $Q_1$ and $Q_3$, controlling their thermal stress while also maintaining the recovery current of the opposite freewheel diodes within their maximum ratings.

The present technology separately adjusts, by a closing loop action, the rates of current rise and fall times of each IGBT placed in parallel with another IGBT (or more generally between each power electronic switch placed in parallel with another power electronic switch) according to parasitic inductances of their respective legs. It therefore allows balancing their switching losses while also controlling their overvoltage at turn-off as well as the recovery current at turn-on. This technology equalizes stresses applied to the power electronic switches.

Figure 7:
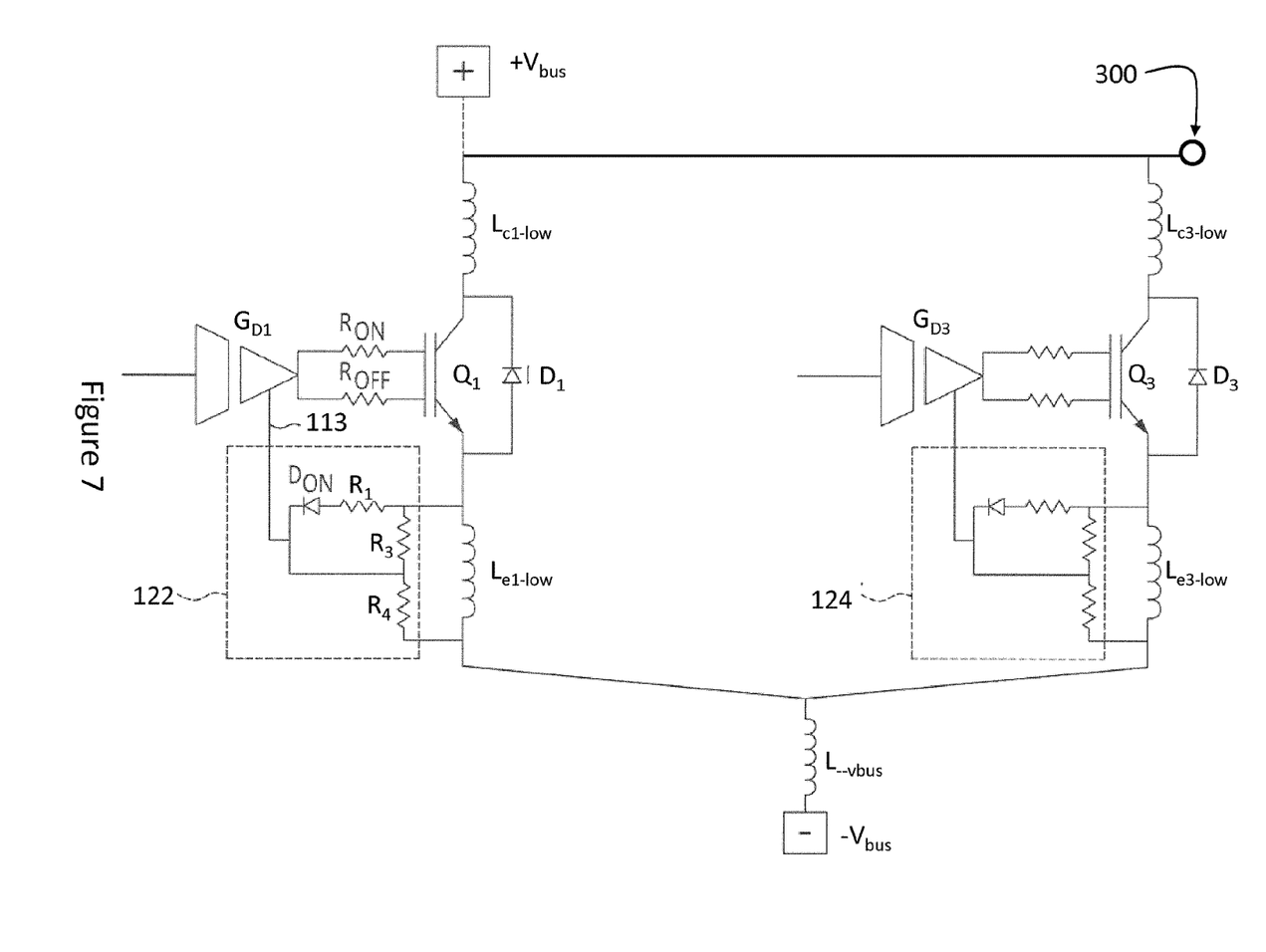
FIG. 7 is a detailed view of a portion of FIG. 5 illustrating a compensation circuit according to a second illustrative embodiment.

FIG. 7 is a detailed view of a portion of FIG. 5 illustrating a compensation circuit according to a second illustrative embodiment. The second embodiment of FIG. 7 discloses a compensation circuit 122 that differs from the compensation circuit 112 in that the resistor $R_2$ and the turn-off diode $D_{off}$ have been removed.

The compensation circuit 122 thus includes the resistor $R_1$ that is so connected as to be parallel with resistor $R_3$ during turn-on, when the emitter voltage of the IGBT $Q_1$ is higher than the reference 113. The diode $D_{on}$ interconnects the resistor $R_1$ to the reference 113 of the gate driver $G_{D1}$. Accordingly, the values of $R_1$ in parallel with $R_3$ and the value of $R_4$ are selected to feed back the adequate portion of signal to the gate driver during turn-on.

The compensation circuit 122 forms a turn-off resistive divider circuit comprising resistors $R_3$ and $R_4$ connected in series and across the parasitic emitter inductance $L_{e1-low}$. The diode $D_{off}$ is not required in the configuration of the compensation circuit 122 since the configuration of the diode $D_{on}$ ensures that the resistor $R_1$ is not in play at turn-off.

During turn-off, a ratio of $R_3$ over $R_4$ combined with $R_{off}$ sets the current fall rate to adjust the overvoltage limit in the IGBT $Q_1$. Values of the two resistors $R_3$ and $R_4$ determine the feedback portion of the voltage induced in the parasitic emitter inductance that is injected in the gate circuit of the IGBT $Q_1$. The values of these resistors are adjusted to keep the overvoltage on the IGBT $Q_1$ under its rated limit and to balance turn-off losses between the IGBTs $Q_1$ and $Q_3$, the latter benefiting from the use of a similar compensation circuit 124.

It may be noted that while the compensation circuit 122 has less elements than the compensation circuit 112 of FIG. 6, the resistor $R_2$ and the diode $D_{off}$ being absent, this compensation circuit provides less adjustment flexibility.

In the foregoing, the voltage induced across the parasitic emitter inductance $L_{e1-low}$ was selected to be fed back to the gate driver $G_{D1}$ to improve the behavior of the IGBT $Q_1$ at turn-on and turn-off and to reduce the dynamic unbalance that may occur in the case of parallelized power electronic switches by balancing their switching currents at turn-on and turn-off. Alternatively, voltages induced in other parasitic inductances may also be used to provide such feedback, inasmuch as the sample voltage is obtained from a parasitic inductance of the same leg as the power electronic switch that is being controlled.

The present description of the compensation circuits 112 and 122, which also applies to the other compensation circuits have been shown and described referring to resistive circuits used to select the portion of the voltage induced in the parasitic emitter inductances. Use of other types of circuits to select a portion of the induced voltage such as for example circuits including transformers or other voltage adaptors is also contemplated.

The foregoing describes solutions applicable to DC-DC converters and to DC-AC power converters for example to commutation cells using a full leg of semiconductors, opposite pairs of power electronic switches and freewheel diodes or to parallel semiconductor legs, to provide alternative current to a connected load such as a motor of an electric vehicle.

Those of ordinary skill in the art will realize that the description of the commutation cell, power converter and compensation circuit are illustrative only and are not intended to be in any way limiting. Other embodiments will readily suggest themselves to such persons with ordinary skill in the art having the benefit of the present disclosure. Furthermore, the commutation cell, power converter and compensation circuit may be customized to offer valuable solutions to existing needs and problems related to variable characteristics of power electronic switches used in commutation cells and in power converters.

In the interest of clarity, not all of the routine features of the implementations of the commutation cell power converter and compensation circuit are shown and described herein. It will of course be appreciated that in the development of any such actual implementation of the commutation cell power converter and compensation circuit numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of power electronics having the benefit of the present disclosure.

It is to be understood that the commutation cell, power converter and compensation circuit are not limited in their application to the details of construction and parts illustrated in the accompanying drawings and described hereinabove. The proposed commutation cell power converter and compensation circuit are capable of other embodiments and of being practiced in various ways. It is also to be understood that the phraseology or terminology used herein is for the purpose of description and not limitation. Hence, although the commutation cell power converter and compensation circuit have been described hereinabove by way of illustrative embodiments thereof, they can be modified, without departing from the spirit, scope and nature of the subject invention.

What is claimed is:

1. A compensation circuit for independently controlling turn-on and turn-off of a power electronic switch through a gate driver having a gate driver reference connection the compensation circuit comprising:
    a first circuit path configured to sample a first portion of a voltage induced across an inductance of the power electronic switch at turn-on of the power electronic switch, the first circuit path including first and second resistors connected in series and across the inductance, and a turn-on diode connected between a junction of the first and second resistors and the gate driver reference connection the turn-on diode being non-conductive during turn-off; and
    a second circuit path configured to sample a second portion of the voltage induced across the inductance of the power electronic switch at turn-off of the power electronic switch, the second circuit path including third and fourth resistors connected in series and across the inductance and a turn-off diode connected between a junction of the third and fourth resistors and the gate driver reference connection the turn-off diode being non-conductive during turn-on,
    wherein the gate driver reference connection is configured to respectively supply the first and second portions of the voltage during turn-on and turn-off of the power electronic switch.

2. The compensation circuit of claim 1, wherein the inductance is a parasitic inductance of the power electronic switch.

3. A compensation circuit for independently controlling turn-on and turn-off of a first power electronic switch that is placed in parallel with a second power electronic switch, the control being done through a gate driver having a gate driver reference connection the compensation circuit comprising:
    a first circuit path configured to sample a first portion of a voltage induced across an inductance of the first power electronic switch at turn-on of the first power electronic switch, the first circuit path including first and second resistors connected in series and across the inductance, and a turn-on diode connected between a junction of the first and second resistors and the gate driver reference connection the turn-on diode being non-conductive during turn-off; and
    a second circuit path configured to sample a second portion of the voltage induced across the inductance of the first power electronic switch at turn-off of the first power electronic switch, the second circuit path including third and fourth resistors connected in series and across the inductance, and a turn-off diode connected between a junction of the third and fourth resistors and the gate driver reference connection, the turn-off diode being non-conductive during turn-on
    wherein the gate driver reference connection is configured to respectively supply the first and second portions of the voltage during turn-on and turn-off of the first power electronic switch.

4. The compensation circuit of claim 3, wherein the inductance is a parasitic inductance of the first power electronic switch.

5. A commutation cell configured for limiting switching overvoltage, comprising:
    a power electronic switch having a parasitic inductance through which a voltage is generated upon turning on and off of the power electronic switch; and
    a compensation circuit for independently controlling turn-on and turn-off of the power electronic switch through a gate driver having a reference connection, the compensation circuit comprising:
        a first circuit path configured to sample a first portion of a voltage induced across an inductance of the power electronic switch at turn-on of the power electronic switch the first circuit path including first and second resistors connected in series and across the inductance and a turn-on diode connected between a junction of the first and second resistors and the gate driver reference connection the turn-on diode being non-conductive during turn-off; and
        a second circuit path configured to sample a second portion of the voltage induced across the inductance of the power electronic switch at turn-off of the power electronic switch the second circuit path including third and fourth resistors connected in series and across the inductance and a turn-off diode connected between a junction of the third and fourth resistors and the gate driver reference connection the turn-off diode being non-conductive during turn-on, wherein the gate driver reference connection configured to respectively supply the first and second portions of the voltage during turn-on and turn-off of the power electronic switch, and wherein the compensation circuit is connected to the parasitic inductance.

6. The commutation cell of claim 5, wherein the compensation circuit applies samples of the voltage generated through the parasitic inductance using different gains at turn-on and at turn-off of the power electronic switch.

7. The commutation cell of claim 5, wherein the power electronic switch is selected from an isolated gate bipolar transistor a metal-oxide-semiconductor field-effect transistor and a bipolar transistor.

8. The commutation cell of claim 5, comprising a freewheel diode operating in tandem with the power electronic switch.

9. The commutation cell of claim 5, wherein the gate driver is connected to the compensation circuit at the gate driver reference connection and wherein the gate driver is also connected to a gate of the power electronic switch the gate driver controlling a gate to emitter voltage applied to the power electronic switch.

10. The commutation cell of claim 9, comprising a turn-on resistor and a turn-off resistor separately connecting the gate driver to the gate of the power electronic switch.

11. The commutation cell of claim 9, wherein the parasitic inductance is a parasitic emitter inductance.

12. The commutation cell of claim 9, wherein the power electronic switch is placed in parallel with another power electronic switch.

13. The commutation cell of claim 5, wherein the parasitic inductance is a parasitic emitter inductance.

14. The commutation cell of claim 5, wherein the power electronic switch is placed in parallel with another power electronic switch.

15. A power converter, comprising:
a pair of parallel legs, each leg having a pair of power electronic switches connected in series, each power electronic switch being provided with a compensation circuit for independently controlling turn-on and turn-off of each power electronic switch each compensation circuit comprising:

a first circuit path configured to sample a first portion of a voltage induced across an inductance of the power electronic switch at turn-on of the power electronic switch the first circuit path including first and second resistors connected in series and across the inductance and a turn-on diode connected between a junction of the first and second resistors and a gate driver reference connection the turn-on diode being non-conductive during turn-off; and a second circuit path configured to sample a second portion of the voltage induced across the inductance of the power electronic switch at turn-off of the power electronic switch the second circuit path including third and fourth resistors connected in series and across the inductance, and a turn-off diode connected between a junction of the third and fourth resistors and the gate driver reference connection, the turn-off diode being non-conductive during turn-on; and a gate driver having the gate driver reference connection configured to respectively supply the first and second portions of the voltage during turn-on and turn-off of the power electronic switch.

16. The power converter of claim 15, wherein each of the compensation circuits is configured to control turn-on and turn-off of a corresponding power electronic switch.

17. The power converter of claim 15, wherein the compensation circuit is connected to a parasitic inductance.

18. The power converter of claim 15, wherein each pair of parallelized power electronic switches are selected from a same manufacturing batch.

19. The power converter of claim 15, wherein all power electronic switches are selected from a same manufacturing batch.

* * * * *